US005134341A

United States Patent [19]

Jödicke et al.

[11] Patent Number: 5,134,341

[45] Date of Patent: Jul. 28, 1992

[54] QUASI-OPTICAL GYROTRON HAVING A YOKE STRUCTURE SHIELDING THE SUPERCONDUCTIVE RESONATOR FROM UNWANTED MAGNETIC FIELDS

[75] Inventors: Bernd Jödicke, Unterehrendingen; Hans-Günter Mathews, Oberehrendingen, both of Switzerland

[73] Assignee: ASEA Brown Boveri Ltd., Baden, Switzerland

[21] Appl. No.: 533,822

[22] Filed: Jun. 6, 1990

[30] Foreign Application Priority Data

Jun. 12, 1989 [CH] Switzerland ........................ 2189/89

[51] Int. Cl.[5] ........................ H01J 23/02; H03B 9/01

[52] U.S. Cl. ........................................ 315/5; 331/79; 333/995; 335/214; 505/700

[58] Field of Search ..................... 315/4, 5, 5.16, 5.31, 315/5.29, 5.39, 39; 333/227, 995; 335/214; 331/79; 372/2; 505/1, 700

[56] References Cited

U.S. PATENT DOCUMENTS

| | | | |
|---|---|---|---|
| 3,325,678 | 6/1967 | Krug, Jr. et al. | 335/214 X |
| 3,466,499 | 9/1969 | Beth | 335/214 X |
| 4,224,576 | 9/1980 | Granatstein et al. | 330/4 |
| 4,733,133 | 3/1988 | Dandl | 315/111.41 |
| 4,828,931 | 5/1989 | Ogawa | 505/1 X |

FOREIGN PATENT DOCUMENTS 664045 1/1988 Switzerland .

OTHER PUBLICATIONS

Grundmann et al., "Electromagnetic Yoke Shield", Abstract of disclosed Patent Application Ser. No. 84272; O.G. vol. 648, pp. 949-950; Jul. 17, 1951.

International Journal of Electronics, vol. 57, No. 6, Dec. 1984, London, GB, pp. 1019-1031, Xu Kongyi et al., "Gyrotron With Multi-Mirror Quasi-Optical Cavity".

International Journal of Electronics, vol. 57, No. 6, Dec. 1984, London, GB, pp. 977-984, T. A. Hargreaves et al., "Experimental Study of a Single-Mode Quasi--Optical Gyrotron".

Brown Boveri Review, Jun. 1987, pp. 303-307, H. G. Mathews et al., "Das Gyrotron, Schlusselkomponente fur Hochleistungs-Mikrowellen-Sender" (The Gyrotron, Key Component for High-Power Microwave Transmitters).

Twelth International Conference on Infrared and Millimeter Waves, Dec. 14-18, 1987, Lake Buena Vista, Fla., pp. 51-52, D. R. Cohn et al., "Possibilities for Microwave/Far Infrared Cavities and Waveguides Using High Temperature Superconductors".

*Primary Examiner*—Eugene R. LaRoche .
*Assistant Examiner*—Benny T. Lee
*Attorney, Agent, or Firm*—Oblon, Spivak, McClelland, Maier & Neustadt

[57] ABSTRACT

In a quasi-optical gyrotron, two coils (3*a*, 3*b*) in a Helmholtz arrangement generate a static magnetic field which is axially symmetrical with respect to an electron beam axis (2). As a result, the electrons passing along the electron beam axis (2) parallel to the magnetic field are forced into gyration and excite an alternating electromagnetic field in a quasi-optical resonator. The resonator comprises two mirrors (4*a*, 4*b*) which are arranged opposite to one another on a resonator axis (5) and which exhibit a superconducting reflective surface (6*a*, 6*b*). The resonator axis (5) is aligned perpendicularly to the electron beam axis (2) between the two coils (3*a*, 3*b*). So that the superconduction is not impaired by the strong magnetic field, means for suppressing the magnetic field at the location of the mirros (4*a*, 4*b*) are provided. These means preferably comprise a yoke (10) of a material having a high magnetic permeability.

6 Claims, 2 Drawing Sheets

QUASI-OPTICAL GYROTRON HAVING A YOKE STRUCTURE SHIELDING THE SUPERCONDUCTIVE RESONATOR FROM UNWANTED MAGNETIC FIELDS

BACKGROUND OF THE INVENTION

1. Field of the Invention

The invention relates to a quasi-optical gyrotron in which two coils in a Helmholtz arrangement generate a static magnetic field which is axially symmetrical with respect to an electron beam axis, electrons passing along the electron beam axis parallel to the magnetic field are forced into gyration and excite an alternating electromagnetic field in a quasi-optical resonator which comprises two mirrors arranged opposite to one another on a resonator axis, the resonator axis being aligned perpendicularly to the electron beam axis between the two coils.

2. Description of Background

A quasi-optical gyrotron of the type initially mentioned is known, for example, from Patent CH 664045 or from the article "Das Gyrotron, Schlüsselkomponente für Hochleistungs-Mikrowellensender" (The gyrotron, key component for high-power microwave transmitters), H. G. Mathews, Minh Quang Tran, Brown Boveri Review 6-1987, pages 303–307.

While the microwave power of such gyrotrons is still limited at present to a few 100 kW at operating frequencies of more than about 100 GHz, it should be possible to generate continuous-wave powers of 1 MW and more, having regard to applications in plasma heating for fusion purposes.

The unwanted heating-up of the resonator walls represents one problem in achieving such high-power gyrotrons. This is because, due to the finite electric conductivity of the walls, these walls are heated up by the RF field in the resonator. This limits the achievable microwave power due to the maximum heat loss which can be dissipated.

Increasing the conductivity of the walls lowers the heat loss and correspondingly improves the power capability of the gyrotron. In view of the fact that, on the one hand, normally-conductive metals have hitherto been used exclusively for the resonator and that, on the other hand, high temperature superconductors have recently become available, it appears to be obvious to replace the normal conductors by superconductors in the resonator. This has also been proposed already in the literature (see, for example, "Possibilities for microwave/far infrared cavities and waveguides using high temperature superconductors", D. R. Cohn, L. Bromberg, W. Halverson, B. Lax and P. Woscov, Twelfth International Conference on Infrared and Millimeter Waves, Dec. 14–18, 1987, Lake Buena Vista, Fla., Conference Digest, IEEE Catalog No. 87CH2490-1, page 51–52).

In this connection, the problem is that in a quasi-optical gyrotron the superconductors must operate both in the presence of RF fields (>100 GHz) and in the presence of strong magnetic fields (>5 T). Under these conditions, however, all known superconductors have worse electrical characteristics than copper and thus do not offer any advantages.

SUMMARY OF THE INVENTION

Accordingly, one object of this invention is to provide a novel quasi-optical gyrotron of the type initially mentioned, which is capable of generating microwaves of typically more than 100 GHz with a continuous-wave power (continuous wave=cw) of 1 MW and more.

According to the invention, the solution consists in that the mirrors of the quasi-optical resonator exhibit a superconducting reflective surface and that means for suppressing the magnetic field at the location of the mirrors are provided.

The core of the invention lies in the fact that the magnetic field, which forces the electrons into gyration, must be as homogeneous as possible, but this only in the area of the electron beam. A radial gradient outside this area is permissible. The means for shielding according to the invention result in a magnetic field gradient being produced which ensures that the magnetic field drops off in the radial direction by such an amount that the superconduction is not impaired.

There are various embodiments of the invention. One of these consists in a yoke being provided which essentially encloses the coils. That is to say, it is constructed in such a manner that it absorbs the largest proportion of the magnetic flux outside the coils. This can be achieved both with a yoke which is essentially of one part and with a multi-part yoke. In this arrangement, the yoke must consist of a material having a high magnetic permeability.

The yoke preferably encloses the two coils in the manner of a hollow cylinder provided with a cover and a bottom. The hollow cylinder exhibits openings for the resonator. The mirrors of the resonator are then arranged outside the hollow cylinder behind the openings.

It is particularly advantageous if the yoke consists of several yoke parts which are arranged at regular distances around the coils.

A conceptionally slightly different embodiment consists in the magnetic field at the location of the mirrors being compensated by a corresponding opposing field. The opposing field is generated by an additional coil arrangement outside the two coils responsible for the gyration.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
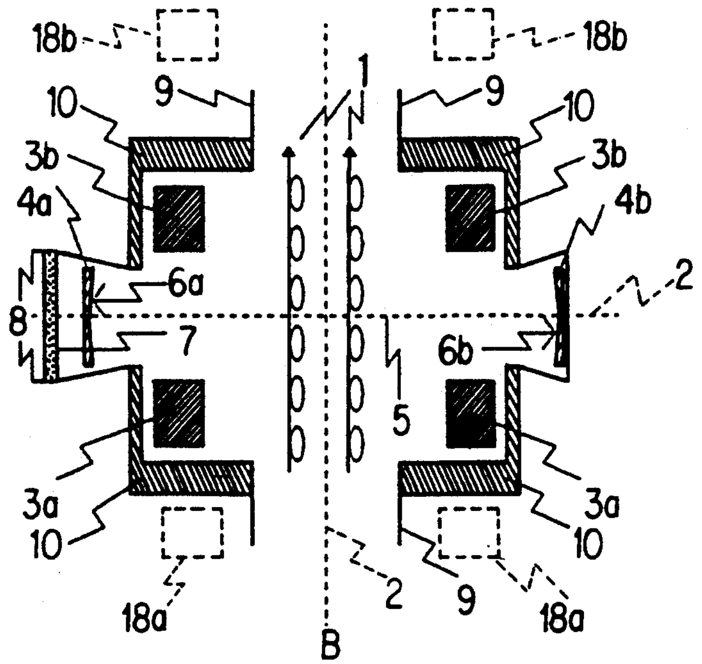
FIG. 1 shows a diagrammatic representation of a quasi-optical gyrotron.

Referring now to the drawings, wherein like reference numerals designate identical or corresponding parts throughout the several views, FIG. 1 shows the parts of a quasi-optical gyrotron according to the invention which are essential for explaining the invention. An electron gun, not shown in the figure, injects electrons in the form of a, for example, annular electron beam 1. The electrons pass along an electron beam axis 2. Two coils 3a and 3b are arranged on the electron beam axis 2 at a distance corresponding to their radius (so-called Helmholtz arrangement). They generate a static magnetic field aligned parallel to the electron beam axis 2 (having a magnetic induction of typically 4 T and more) which forces the electrons into gyration.

Between the two coils 3a, 3b, a quasi-optical resonator is arranged. It consists of two spherical circular mirrors 4a and 4b which are arranged opposite to one another on a resonator axis 5. In this arrangement, the resonator axis is perpendicular to the electron beam axis 2.

The electrons excite an alternating electromagnetic field in the quasi-optical resonator so that the required microwaves are coupled-out at one of the two mirrors 4a and can be conducted through a window 7 and a waveguide 8 to a load. The two coils 3a, 3b, the resonator and, naturally, the electron beam 1 are located in a high vacuum in a vessel 9.

The parts of the quasi-optical gyrotron described up to now are already known (for example from the article by Mathews and Tran cited above) and therefore require no further explanation. What is novel, in contrast, are the means, explained below, for shielding the magnetic field and the type of the resonator.

To shield the magnetic field with respect to the outside, a yoke 10 is provided which essentially encloses the two coils 3a, 3b. It consists of a material having a high magnetic permeability, preferably of iron.

Figure 3:
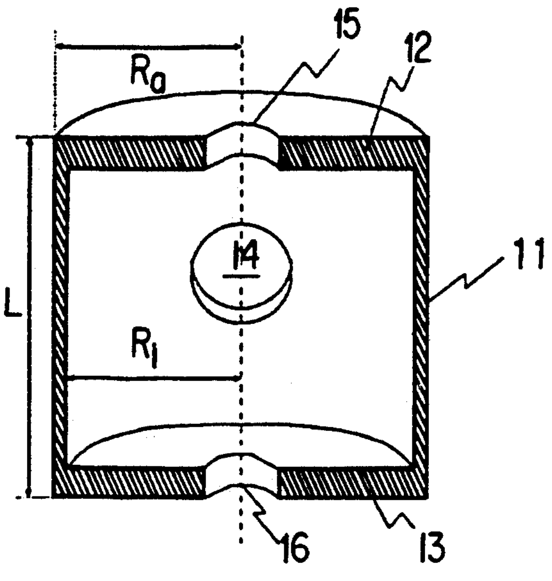
FIG. 3 shows a diagrammatic representation of a hollow-cylindrical yoke.

According to a preferred embodiment shown in FIG. 3 the yoke 10 has the shape of a hollow cylinder 11 having a length L which is closed by a cover 12 and a bottom 13 in the axial direction. The hollow cylinder 11 is coaxial with respect to the electron beam axis 2. The length L and an inside radius Ri of the hollow cylinder 11 are such that the two coils 3a, 3b in Helmholtz arrangement or the vessel 9 enclosing these, respectively, can be accommodated therein (see FIG. 1).

Cover 12 and bottom 13 of the hollow cylinder 11 are each provided with a penetration opening 15, 16, respectively, for the electron beam 2. The penetration openings are kept as small as possible. The hollow cylinder 11 itself also exhibits two mutually diametrically opposite openings for the resonator. These openings are just large enough for the alternating electromagnetic field in the resonator not to be disturbed by them.

The two mirrors 4a, 4b form the walls of the resonator and each have a superconducting refractive surface 6a and 6b, respectively. A cooling device, not shown in the figure, keeps them at a temperature which is sufficiently low for superconduction. The superconducting reflective surfaces 6a,6b are formed, for example, by a layer consisting of a high temperature superconductor.

The two spherical mirrors 4a, 4b are arranged outside the yoke 10 in front of the openings of the hollow cylinder 11. In a symmetrical embodiment, they have a mutual distance which is greater than an outside diameter Ra of the hollow cylinder 11.

Figure 2:
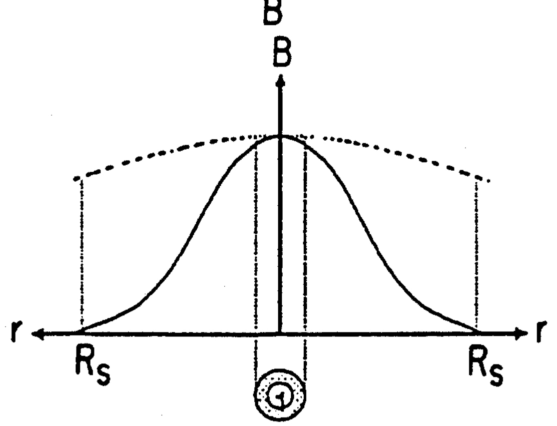
FIG. 2 shows a graphic representation of the magnetic field as a function of the distance from the electron beam axis.

FIG. 2 illustrates the effect of the shielding according to the invention. The radius r, that is to say the distance from the electron beam axis 2, with Rs corresponding to the internal radius of coils 3a, 3b, is symmetrically plotted along the abscissa and the intensity of the magnetic induction B is plotted along the ordinate. The continuous curve represents the variation of the magnetic field in the presence of the yoke 10. In a region close to the axis which corresponds at least to one diameter of the electron beam 1, the magnetic field is almost homogeneous. It then drops off with increasing radius r until, at the location of the mirrors 4a, 4b, it is at least small enough for the superconduction not to be impaired.

The dashed curve shows the variation of the magnetic field without the yoke 10 according to the invention. In this case, the magnetic field is homogeneous over a relatively wide range and only slowly decreases with increasing radius.

FIG. 3 shows a section through the yoke 10. The hollow cylinder 11, having length L, has two openings for the resonator, as previously mentioned, one of which—designated by 14—can be seen in the figure. This opening 14 is made approximately in the center of the hollow cylinder 11. It is typically circular, the resonator axis passing through its center.

Bottom 13 and cover 12 each exhibit a penetration opening 16 and 15, respectively. Finally, the inside radius Ri and outside radius Ra of the hollow cylinder are also drawn.

The yoke 10 of FIG. 1 is obtained if two halves are appropriately joined together in accordance with FIG. 3. Such a yoke creates the best-possible shielding of the magnetic field. However, it is heavy and may be difficult to assemble. Such disadvantages can be avoided, however, by means of the embodiment described below.

Figure 4:
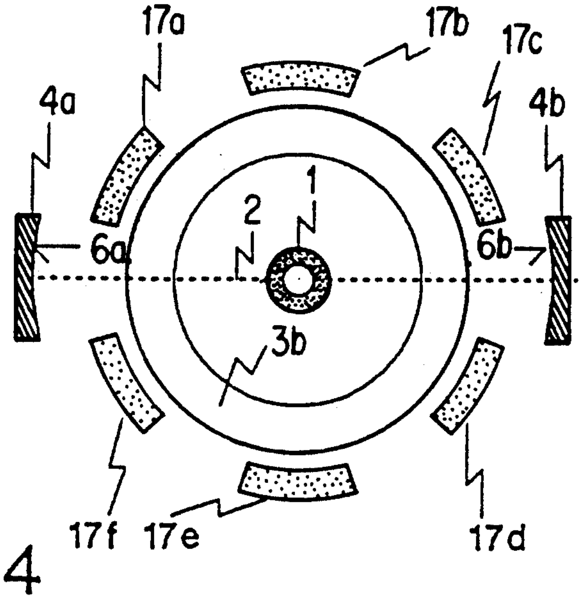
FIG. 4 shows a diagrammatic representation of a quasi-optical gyrotron having several yoke parts.

FIG. 4 shows a quasi-optical gyrotron having a yoke which consists of several yoke parts 17a, 17b, 17c, 17d, 17e, 17f. The following parts can be recognized in the figure: the resonator axis 5, the two mirrors 4a, 4b, one of the two coils 3a and the annular electron beam 1. The electron beam axis is perpendicular to the plane of the drawing in the representation according to FIG. 4.

According to particularly preferred embodiment, the yoke comprises six essentially identical yoke parts 17a, 17b, 17c, 17d, 17e, 17f. These are arranged at regular mutual distances around the electron beam axis or the coils, respectively. Two mutually diametrically opposite intermediate spaces are used as opening for the resonator.

Figure 5:
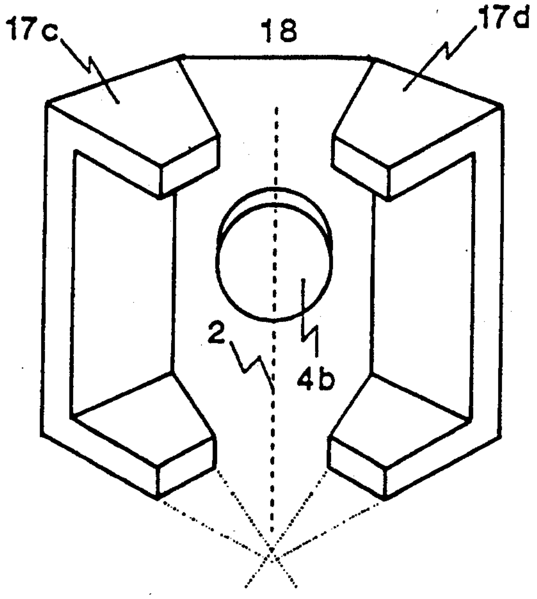
FIG. 5 shows a diagrammatic representation of the hollow-cylindrical yoke parts and their position with respect to the resonator.

FIG. 5 shows two such yoke parts 17c, 17d with the gap-shaped intermediate space used as opening 18. The mirror 4b has a distance from the electron beam axis 2 which is greater than the outside diameter of the yoke.

The yoke parts 17a, 17b, 17c, 17d, 17e, 17f form segments of a hollow cylinder which is closed by means of a bottom and a cover in the axial direction. In principle, they are nothing other than azimuthally limited sections of a hollow-cylindrical yoke, as has been explained with reference to FIGS. 1 and 3. They have pie shaped configuration.

The yoke formed of the six yoke parts 17a, 17b, 17c, 17d, 17e, 17f essentially completely encloses the coils. Due to the high magnetic permeability, the greatest proportion of the magnetic flux is concentrated on the yoke parts. The magnetic field is sufficiently small outside the can-shaped area enclosed by yoke parts.

In principle, it is important that the rotational symmetry of the magnetic field is retained as well as possible in the area close to the axis of the electron beam 1 in spite of the shielding. When a yoke is used which essentially consists of one coherent part, this is also unambiguously the case. If, in contrast, several yoke parts are used, special attention must be paid to this aspect. This is why preferably at least six yoke parts are attached to the gyrotron.

Although the rotational symmetry can be approximated better and better with an increasing number of yoke parts, the regular intermediate space becomes smaller and smaller at the same time. At the same time, however, the resonator must have a minimum opening in order to be able to operate at all. And, last but not least, assembly should be simple.

From these considerations, a yoke having eight yoke parts is also considered to be a preferred embodiment of the invention.

Naturally, the yoke parts do not need to be shaped exactly as has been described with reference to the figures. On the contrary, the invention also includes certain variations. These can be circumscribed in such a manner that "material is removed" in a suitable manner from a can-like yoke, as has been shown in FIGS. 1 and 3, so that the volume and weight of the yoke become less but, at the same time, the magnetic shielding effect is essentially retained.

In principle, a material which has a magnetic permeability which is great in relation to that of the vacuum is suitable for the yoke. Iron represents only one typical candidate in this context.

An embodiment slightly deviating from the previous examples does not use a yoke as shielding but a compensating magnetic field. This is generated by two or more additional coils. The additional coils 18*a*, 18*b*, are located outside the cylindrical volume enclosed by Helmholtz coils.

For example, the additional coils 18*a*, 18*b* are also coaxial with respect to the electron beam axis. Radius, distance and coil current of the additional coils must then be dimensioned in such a manner that the intensity of the magnetic field at the location of the mirrors of the resonator is overall below a threshold required for superconduction. The actual dimensions depend on various parameter values and can be easily determined by calculation.

The "active" and the "passive" approach may also be combined by improving the effect of a geometrically simple yoke by means of suitably designed small coils.

In summary, it can be said that the power of quasi-optical gyrotrons can be considerably increased by the invention in that the advantages of superconducting resonator walls can be fully utilized.

Obviously, numerous modifications and variations of the present invention are possible in light of the above teachings. It is therefore to be understood that within the scope of the appended claims, the invention may be practiced otherwise than as specifically described herein.

What is claied as new and desired to be secured by Letters Patent of the United States is:

1. A quasi-optical gyrotron, comprising:

an evacuated gyrotron chamber with a gyrotron main axis;

first means for emitting an electron beam along an electron beam axis aligned parallel to said gyrotron main axis;

two identical coils, each having a coil radius, for producing a static magnetic field aligned parallel to said electron beam axis and causing electrons on said electron beam to gyrate, said two coils each being aligned coaxially to said electron beam axis and being separated along said electron beam axis by a distance which equals said coil radius;

a quasi-optical resonator including two mirrors arranged opposite to one another on a resonator longitudinal axis aligned perpendicular to said electron beam axis, said quasi-optical resonator being arranged between said two coils, such that said gyrating electrons of said electron beam excite an alternating electromagnetic field in said quasi-optical resonator;

said two mirrors of the quasi-optical resonator having a superconducting reflective surface;

second means for suppressing said magnetic field caused by said two coils at the location of said two mirrors, said second means comprising a yoke consisting of a material having a high magnetic permeability, said yoke enclosing there within an inner space separated by said yoke from an outer space not enclosed within said yoke;

said two coils each being situated in said inner space;

said two mirrors of said quasi-optical resonator being situated in said outer space.

2. A quasi-optical gyrotron as claimed in claim 1, wherein the material having the high magnetic permeability is iron.

3. A quasi-optical gyrotron as claimed in claim 1, wherein: p1 said yoke is constructed as a hollow cylinder having a cylinder axis, said cylinder having a side wall, a bottom and a cover;

said hollow cylinder is provided with at least two mutually diametrically opposite openings in said side wall, said quasi-optical resonator aligned with said openings; and said bottom and said cover are provided with one penetration opening each for said electrons passing along said electron beam axis.

4. A quasi-optical gyrotron as claimed in claim 1, wherein:

said yoke comprises plural identical yoke parts arranged at regular intermediate spaces around said electron beam axis; and said plural yoke ports defining openings for said quasi-optical resonator by means of two mutually diametrically opposite intermediate spaces located between said yoke parts.

5. A quasi-optical gyrotron as claimed in claim 4, wherein:

said yoke parts together form a slotted hollow cylinder with a cylindrical axis aligned parallel to said electron beam axis; and said slotted hollow cylinder is closed by means of a cover and a bottom in the direction of said cylindrical axis.

6. A quasi-optical gyrotron as claimed in claim 4, wherein said yoke comprises at least six yoke parts.

* * * * *